(12) United States Patent
Konishi

(10) Patent No.: US 12,349,299 B2
(45) Date of Patent: Jul. 1, 2025

(54) ELECTRIC CIRCUIT BOARD AND POWER MODULE

(71) Applicant: KYOCERA Corporation, Kyoto (JP)

(72) Inventor: Yoshitada Konishi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 273 days.

(21) Appl. No.: 17/639,184

(22) PCT Filed: Aug. 26, 2020

(86) PCT No.: PCT/JP2020/032109
§ 371 (c)(1),
(2) Date: Feb. 28, 2022

(87) PCT Pub. No.: WO2021/039816
PCT Pub. Date: Mar. 4, 2021

(65) Prior Publication Data
US 2022/0330447 A1    Oct. 13, 2022

(30) Foreign Application Priority Data
Aug. 29, 2019 (JP) ................... 2019-157199

(51) Int. Cl.
*H05K 5/06* (2006.01)
*H05K 1/09* (2006.01)
(Continued)

(52) U.S. Cl.
CPC ............. *H05K 5/064* (2013.01); *H05K 1/09* (2013.01); *H05K 1/181* (2013.01); *H05K 7/1427* (2013.01); *H05K 2201/032* (2013.01)

(58) Field of Classification Search
USPC ................. 361/690–710, 760–763, 767; 174/250–253, 257–258
See application file for complete search history.

(56) References Cited

U.S. PATENT DOCUMENTS 6,054,762 A * 4/2000 Sakuraba ............. H05K 1/0271
257/E23.009
8,563,869 B2 * 10/2013 Kaga ................... H01L 23/3735
29/829

(Continued)

FOREIGN PATENT DOCUMENTS

JP    06-334077 A    12/1994
JP    10-326949 A    12/1998
(Continued)

OTHER PUBLICATIONS

Extended European Search Report dated Aug. 21, 2023 for European Patent Application No. 20858188.4.

*Primary Examiner* — Tuan T Dinh
(74) *Attorney, Agent, or Firm* — Volpe Koenig

(57) ABSTRACT

An electric circuit board includes an insulating substrate, a metal plate, and a brazing material with which the insulating substrate and the metal plate are joined together. The metal plate has a side surface over which recessed portions are scattered. The side surface of the metal plate has lines in regions around the recessed portions. The metal plate is made of copper or a copper alloy. The brazing material has a side surface that is continuous with the side surface of the metal plate. The brazing material is a silver-copper brazing alloy. A ratio of copper on the side surface of the brazing material is higher than a copper component ratio of the silver-copper brazing alloy.

8 Claims, 6 Drawing Sheets

(51) Int. Cl.
*H05K 1/18* (2006.01)
*H05K 7/14* (2006.01)

(56) References Cited

U.S. PATENT DOCUMENTS

| | | | | |
|---|---|---|---|---|
| 8,564,118 | B2* | 10/2013 | Kuromitsu | C04B 37/026 |
| | | | | 257/713 |
| 9,833,855 | B2* | 12/2017 | Terasaki | B23K 35/3611 |
| 2002/0060091 | A1* | 5/2002 | Naba | H05K 3/381 |
| | | | | 174/250 |
| 2003/0066865 | A1* | 4/2003 | Tsukaguchi | H05K 3/26 |
| | | | | 228/206 |
| 2009/0243089 | A1* | 10/2009 | Hohlfeld | H01L 24/32 |
| | | | | 257/734 |
| 2010/0065962 | A1* | 3/2010 | Bayerer | H01L 24/49 |
| | | | | 257/E23.009 |
| 2011/0298121 | A1* | 12/2011 | Nishibori | H01L 25/072 |
| | | | | 257/784 |
| 2014/0071633 | A1* | 3/2014 | Kuromitsu | H05K 1/181 |
| | | | | 174/257 |
| 2014/0144677 | A1 | 5/2014 | Wang et al. | |
| 2015/0092379 | A1* | 4/2015 | Yoshimatsu | H05K 3/284 |
| | | | | 216/13 |
| 2015/0313011 | A1* | 10/2015 | Terasaki | B23K 35/3006 |
| | | | | 228/122.1 |
| 2017/0294322 | A1* | 10/2017 | Morita | H01L 21/4846 |
| 2018/0057412 | A1* | 3/2018 | Kato | H01L 23/13 |
| 2018/0090412 | A1 | 3/2018 | Ikeda et al. | |
| 2018/0190568 | A1* | 7/2018 | Naba | C04B 37/026 |
| 2019/0172765 | A1* | 6/2019 | Kato | B23K 1/0016 |

FOREIGN PATENT DOCUMENTS

| | | |
|---|---|---|
| JP | 11-168277 A | 6/1999 |
| JP | 2000-261149 A | 9/2000 |
| JP | 2004-034524 A | 2/2004 |
| JP | 2007-053349 A | 3/2007 |
| JP | 2014-072304 A | 4/2014 |
| JP | 2019-106422 A | 6/2019 |

* cited by examiner

ELECTRIC CIRCUIT BOARD AND POWER MODULE

TECHNICAL FIELD

The present disclosure relates to an electric circuit board in which a metal plate that serves as a wiring material is joined to an insulating substrate with a brazing material, and a power module including the electric circuit board.

BACKGROUND

An electric circuit board is used in an electronic device, such as a power module, in which an electronic component, such as an insulated gate bipolar transistor (IGBT), is mounted. A known example of such an electric circuit board includes an insulating substrate composed of, for example, a ceramic sintered body and metal plates made of a metal material, such as copper, that are joined to an upper surface of the insulating substrate.

The metal plates may be produced by a punching process so that the metal plates have side surfaces perpendicular to the upper surface of the insulating substrate. Thus, the metal plates may be arranged with smaller intervals (narrower gaps) therebetween (between the side surfaces thereof) (see, for example, Japanese Unexamined Patent Application Publication No. 2007-53349).

The metal plates may be joined to the insulating substrate by placing the metal plates on the insulating substrate with a brazing material applied between each metal plate and the insulating substrate and performing a brazing process.

Japanese Unexamined Patent Application Publication No. 2014-72304 describes a semiconductor module in which metal plates, electronic components mounted on the metal plates, and an insulating substrate are sealed with a molding resin.

SUMMARY

An electric circuit board according to an aspect of present disclosure includes an insulating substrate, a metal plate, and a brazing material with which the insulating substrate and the metal plate are joined together. The metal plate has a side surface over which a plurality of recessed portions are scattered.

DETAILED DESCRIPTION

Figure 1A:
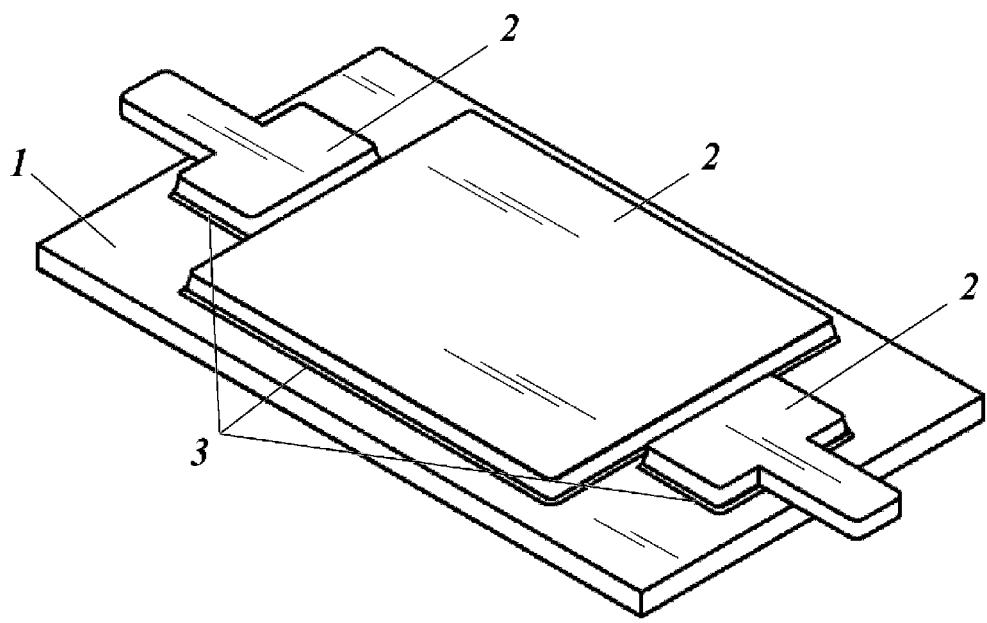
FIG. 1A is a perspective view of an example of an electric circuit board.
Figure 1B:
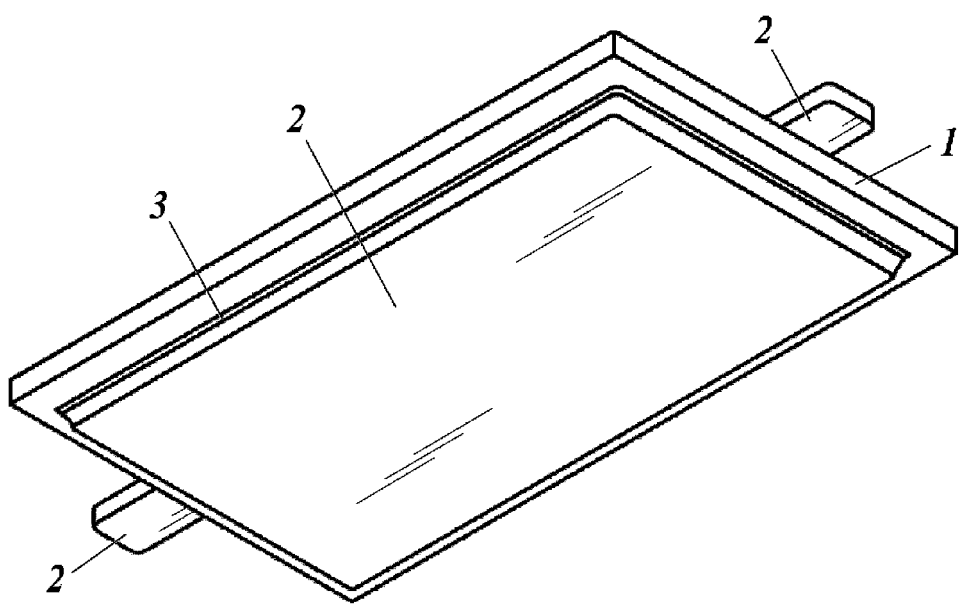
FIG. 1B is another perspective view of the example of an electric circuit board.
Figure 2A:
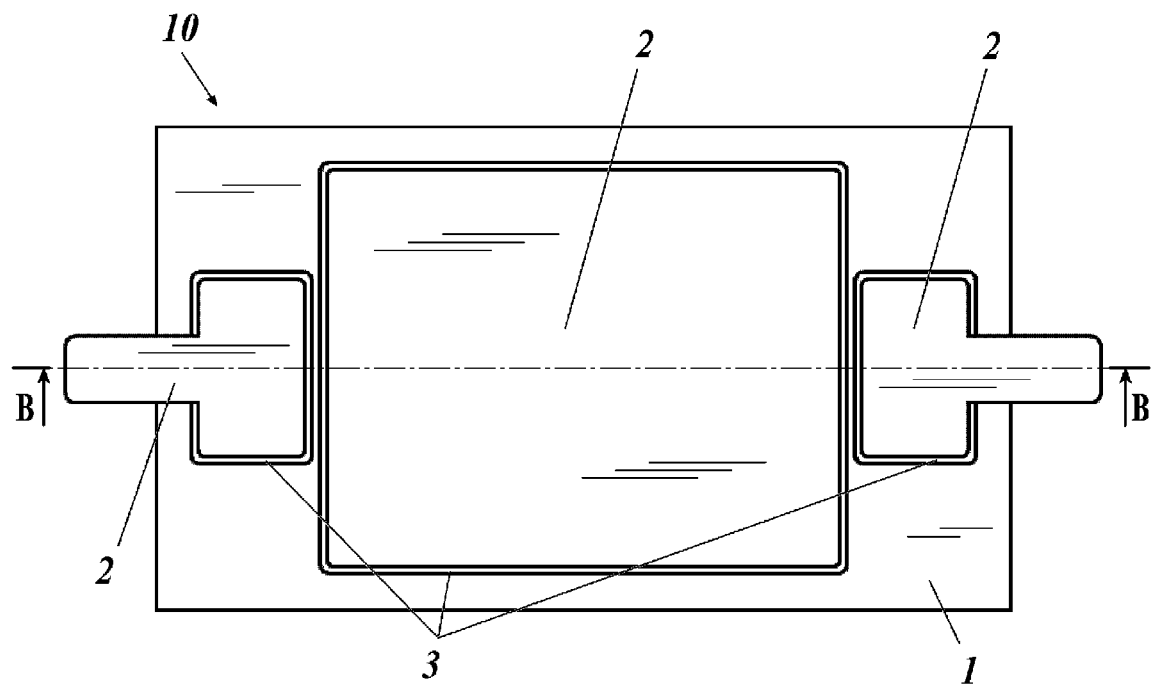
FIG. 2A is a top view of an electric circuit board illustrated in FIGS. 1A and 1B.
Figure 2B:
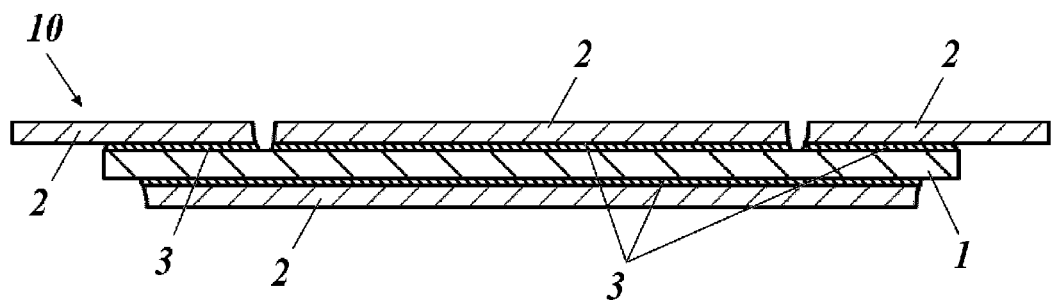
FIG. 2B is a sectional view of FIG. 2A taken along line B-B.

Electric circuit boards and power modules according to an embodiment of the present disclosure will now be described with reference to the drawings. In the following description, upper and lower sides are referred to for convenience, but do not limit the actual upper and lower sides of the electric circuit board in use.

<Electric Circuit Board>

As illustrated in FIGS. 1A, 1B, 2A, and 2B, an electric circuit board 10 according to the present embodiment includes an insulating substrate 1 and metal plates 2 joined to principal surfaces (upper and lower surfaces) of the insulating substrate 1 with a brazing material 3. Multiple metal plates 2, 2, and 2 are joined to the upper surface of the insulating substrate 1, and a single metal plate 2 is joined to the lower surface of the insulating substrate 1.

Preferably, the insulating substrate 1 is composed of a ceramic sintered body and has a high mechanical strength and good heat transfer characteristics (cooling characteristics). The ceramic sintered body may be made of a known material and may be, for example, an alumina ($Al_2O_3$) sintered body, an aluminum nitride (AlN) sintered body, a silicon nitride ($Si_3N_4$) sintered body, or a silicon carbide (SiC) sintered body. The insulating substrate 1 may be manufactured by a known manufacturing method, for example, by preparing raw material powder composed of alumina powder to which a sintering additive is added, kneading the raw material powder together with, for example, an organic binder into the shape of a substrate, and firing the substrate.

In the present embodiment, the metal plates 2 are made of copper (Cu) or a copper alloy. The brazing material 3 may be an active metal brazing material that is a silver-copper (Ag—Cu) brazing alloy containing an active metal, such as titanium (Ti), hafnium (Hf), or zirconium (Zr). When the metal plates 2 are made of aluminum (Al) or an aluminum alloy, a brazing material composed of an Al—Si based alloy or an Al—Ge based alloy may be used.

Each metal plate 2 may have a plating layer provided on a surface thereof to protect the surface or to facilitate joining of, for example, a bonding wire thereto. The plating layer may be a metal plating layer made of, for example, palladium, nickel, or silver.

Figure 3:
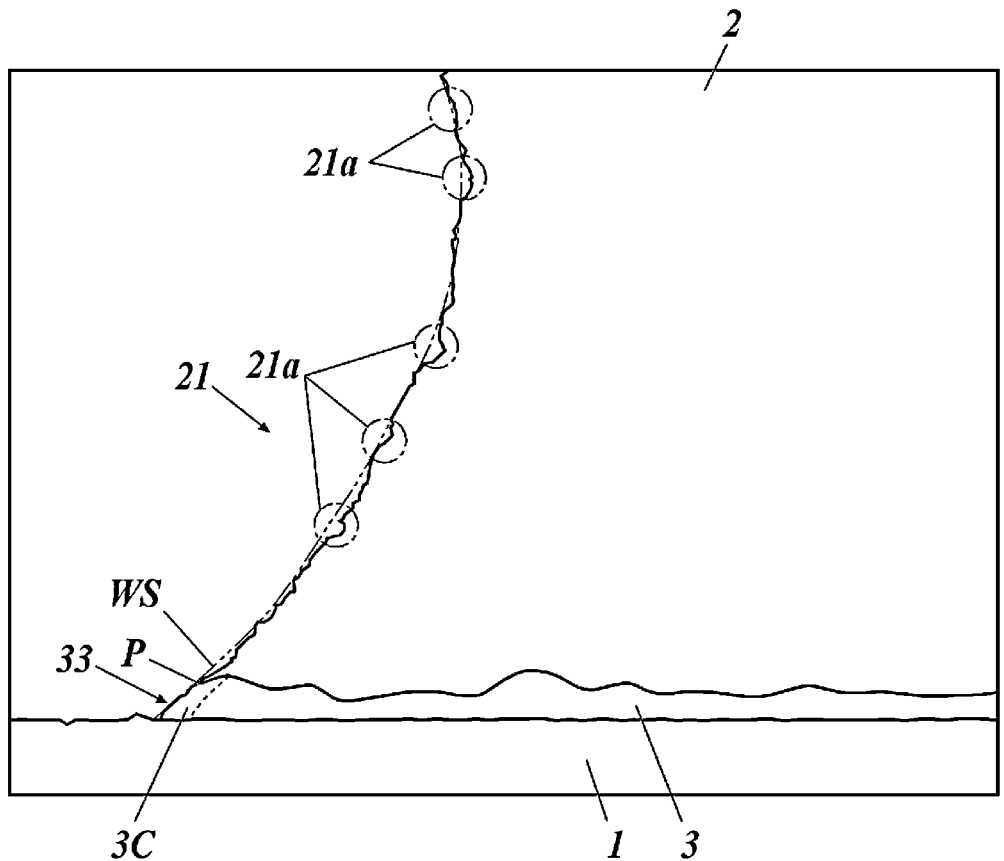
FIG. 3 is a vertical sectional view of a part of the electric circuit board.
Figure 4:
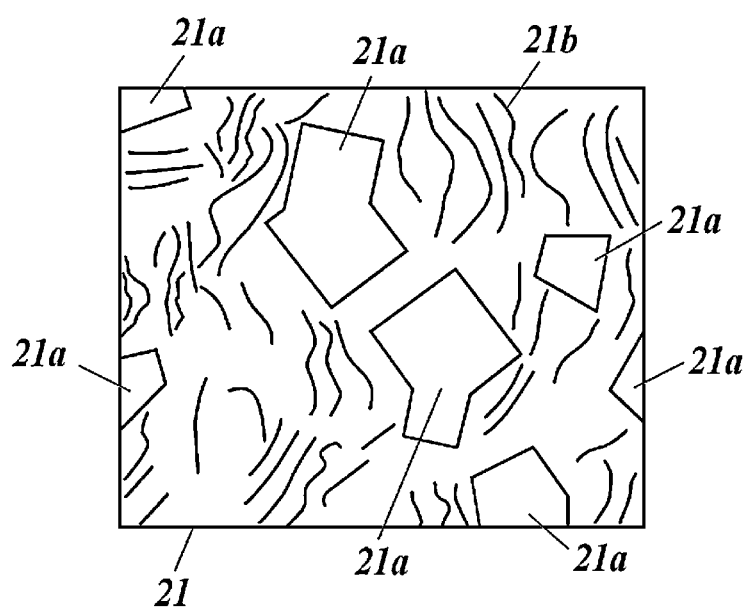
FIG. 4 is an enlarged side view of a part of a side surface of the metal plate.

FIG. 3 is a vertical sectional view of a side surface 21 of each metal plate 2 and a side surface 33 of the brazing material 3. FIG. 4 is an enlarged side view of a part of the side surface 21 of the metal plate 2.

The metal plate 2 has a plurality of recessed portions 21a scattered over the side surface 21 thereof. The recessed portions 21a are portions recessed from the side surface 21 of the metal plate 2.

When a sealing resin is used, the resin extends into the recessed portions 21a so that the adhesion between the sealing resin (50) and the side surface 21 is improved. Since the side surface 21 has no projections that project from the surrounding regions, cracks extending from projections are not easily formed in the sealing resin, and the sealing reliability is high. In addition, the possibility that cracks will be formed in the sealing resin and that the insulation will be degraded due to electric discharge from projections in the cracks is low.

As illustrated in FIG. 4, the side surface 21 of the metal plate 2 has lines 21b in regions around the recessed portions 21a.

The lines 21b are small irregularities (grooves), and therefore serve to further improve the adhesion of the resin.

The lines 21b do not extend in the same direction, and therefore effectively improve the adhesion of the resin against stresses in every direction. In addition, since the lines 21b are short and have a small depth (height), cracks extending from the lines are not easily formed.

When the metal plate 2 is made of copper or a copper alloy, the conduction resistance can be reduced. In addition, as described below, the recessed portions 21a and the lines 21b can be easily formed by etching.

As illustrated in FIG. 3, the side surface 33 of the brazing material 3 may be continuous with the side surface 21 of the metal plate 2. When the metal plate 2 is made of copper or a copper alloy, the brazing material 3 is a silver-copper brazing alloy. In this case, the ratio of copper 3C on the side surface 33 of the brazing material 3 may be higher than the copper component ratio of the silver-copper brazing alloy.

Since the ratio of silver on the side surface 33 of the brazing material 3 is low, migration of silver does not easily occur on the side surface of the brazing material 3. Therefore, two adjacent metal plates 2 and 2 can be reliably insulated from each other.

Since the amount by which the brazing material 3 protrudes from the side surface 21 of each metal plate 2 is small and two adjacent metal plates 2 and 2 are joined with respective brazing materials 3 and 3 that are spaced from each other by a large distance, migration does not easily occur. Accordingly, the interval between the metal plates 2 and 2 can be reduced, so that the electric circuit board 10 and the power module can be reduced in size.

As described above, according to the electric circuit board (10) of the present embodiment, the insulation between the adjacent metal plates (2, 2) and the adhesion between the side surface (21) of each metal plate and the sealing resin (50) can be improved.

As illustrated in FIG. 3, the side surface 33 of the brazing material 3 is continuous with the side surface 21 of the metal plate 2 so that the side surface 33 of the brazing material 3 is not displaced from the side surface 21 of the metal plate 2, nor does it overlap the side surface 21 of the metal plate 2.

Referring to FIG. 3, the side surface 21 of the metal plate 2 and the side surface 33 of the brazing material 3 are in contact with each other at a contact point P, at which a lower edge (P) of the side surface 21 of the metal plate 2 and an upper edge (P) of the side surface 33 of the brazing material 3 adjoin so that the side surface 21 of the metal plate 2 and the side surface 33 of the brazing material 3 form a single concave surface. The concave surface corresponds to a concave curve WS shown by the two-dot chain line in the vertical sectional view of FIG. 3. The concave curve WS shows the side surface 21 of the metal plate 2 before the recessed portions 21a are formed. Also after the recessed portions 21a are formed, the side surface 21 of the metal plate 2 has a concave shape that extends substantially along the concave curve WS in regions excluding the recessed portions 21a. The recessed portions 21a are portions recessed from the concave surface (side surface 21) along the concave curve WS.

Since the side surface 33 of the brazing material 3 is not displaced from the side surface 21 of the metal plate 2, the lower surface of the metal plate 2 is joined with the brazing material 3 over a region extending to the outer edge thereof. Thus, the brazing material 3 is appropriately joined to the metal plate 2.

The amount by which the brazing material 3 protrudes sideways from the metal plate 2 is very small, and almost negligible. Therefore, the metal plate 2 and the metal plate 2 adjacent thereto have a sufficient gap therebetween.

The concave surface formed by the side surface 21 of the metal plate 2 and the side surface 33 of the brazing material 3 is shaped to extend outward toward the bottom. The lower edge of the side surface 33 of the brazing material 3 is positioned outside the upper edge of the side surface 21 of the metal plate 2. As illustrated in FIG. 3, the lower edge of the side surface 33 of the brazing material 3 extends outward beyond the metal plate 2, and an outer edge portion of the metal plate 2 is shaped such that the thickness thereof gradually decreases. Since the outer edge is shaped as described above, the thermal stress generated between the metal plate 2 and the insulating substrate 1 can be reduced, and the brazing material 3 is appropriately joined to the insulating substrate 1. Therefore, separation of the metal plate 2 does not easily occur at an end portion of the metal plate 2.

The concave surface formed by the side surface 21 of the metal plate 2 and the side surface 33 of the brazing material 3 may be shaped to warp outward at the upper end of the side surface 21 of the metal plate 2. In such a case, the upper surface of the metal plate 2 has a large area. In addition, the sealing resin (50) engages with the upper end portion of the side surface 21 of the metal plate 2, so that the possibility of separation is further reduced.

The above-described shape of the metal plate 2 may be formed by performing grinding after a punching process, but may instead be easily formed by etching.

As described above, the metal plate 2 may be appropriately joined to the insulating substrate 1, and a precise gap may be provided between the metal plate 2 and the metal plate 2 adjacent thereto.

<Method for Manufacturing Electric Circuit Board>

A method for manufacturing the electric circuit board will now be described.

(Summary of Manufacturing Method)

1. Pattern Forming Method

Examples of a method for forming the outline pattern of each metal plate 2 and joining the metal plates 2 to the insulating substrate 1 with the brazing material 3 include methods (A) and (B) described below.

(A) Method of patterning the metal plates 2 and then joining the metal plates 2 to the insulating substrate 1.

The patterning process may be either punching or etching. The patterned metal plates 2 may be placed on the insulating substrate 1 having brazing material paste for forming the brazing material 3 applied thereon, and then be heated so that the metal plates 2 are joined to the insulating substrate 1.

The brazing material paste may be applied in patterns (hereinafter referred to also as patterned application) or be applied over the entire surface of the insulating substrate 1 (hereinafter referred to also as entire-surface application).

When the brazing material paste is applied in patterns, the patterns thereof may be somewhat larger than the outline patterns of the metal plate 2 to allow for displacements.

(B) Method of joining a large metal plate and then patterning the metal plate by etching.

The brazing material paste may be applied either by entire-surface application or by patterned application.

When the brazing material 3 is applied by entire-surface application, it is not necessary to position the brazing material 3 with respect to the patterns of the metal plates 2. In either one of methods (A) and (B), when the brazing material 3 is applied by entire-surface application, a portion thereof formed between the metal plates 2 and 2 may be removed by etching to ensure insulation between the metal plates 2 and 2. Also when the brazing material 3 is to be formed such that the side surface 33 thereof is continuous with the side surface 21 of each metal plate 2, a portion of the brazing material 3 that protrudes from the pattern of the metal plate 2 may be removed by etching.

2. Recessed-Portion Forming Method

Examples of a method for forming the recessed portions 21a in the side surface 21 of each metal plate 2 include methods (1) to (3) described below.

(1) Method of forming the recessed portions 21a in the side surface 21 of the metal plate 2 by stamping.

(2) Method of performing etching using a mask pattern having openings at positions where the recessed portions 21a are to be formed in the side surface 21 of the metal plate 2.

(3) Method of performing etching using an etchant that selectively etches portions of the side surface 21 of the metal plate 2.

3. Combinations

The above-described pattern forming methods (A) and (B) and recessed-portion forming methods (1) to (3) may be applied in combinations. When method (A), in which joining is performed after the patterning process, the recessed portions 21a may be formed either before or after the metal plates 2 are joined to the insulating substrate 1. When the patterning process is punching, the recessed portions 21a are formed after the side surface 21 of each metal plate 2 is formed by, for example, grinding the side surface formed by the punching process and removing projections and the like to smooth the side surface.

An example of a method for manufacturing the electric circuit board (manufacturing method 1) based on combinations of the above-described pattern forming methods and recessed-portion forming methods will now be disclosed. The manufacturing method 1 is based on the combination of pattern forming method (B) and recessed-portion forming method (3).

First, the brazing material 3 is applied to the upper and lower surfaces of the insulating substrate 1 over the entire areas thereof by printing, and the metal plates 2 having the same size as that of the insulating substrate 1 in plan view are placed on the brazing material 3 and brazed to the insulating substrate 1 by applying pressure and heat. The insulating substrate 1 is composed of a ceramic sintered body. The metal plates 2 are made of copper or a copper alloy. The brazing material 3 is an active metal brazing material that is a silver-copper (Ag—Cu) brazing alloy containing titanium (Ti) as an active metal.

After that, each metal plate 2 is etched with an etchant, such as a ferric chloride solution, by using a resist mask placed on the upper surface of the metal plate 2 as a mask to form the metal plate 2 into desired circuit patterns. The etching conditions (concentration of the etchant, etching time, etc.) are adjusted so that the side surface 21 of the metal plate 2 is concave.

Next, a portion of the brazing material 3 that protrudes from the outline of each metal plate 2 is removed by etching in the following manner.

That is, the brazing material 3 is etched by alternately using two etchants.

First, etching is performed by using a first solution.

An etchant that mainly dissolves silver (Ag) and titanium (Ti) is selected as the first solution. For example, an etchant containing hydrofluoric acid, aqueous hydrogen peroxide, and ammonia is used.

During etching with the first solution, dissolution of silver and titanium contained in the silver-copper-alloy active metal brazing material progresses in the region between the metal plates 2 and 2.

Next, etching is performed by using a second solution. An etchant that mainly dissolves copper (Cu) is selected as the second solution. For example, an etchant containing sulfuric acid/aqueous hydrogen peroxide or a persulfate/sulfuric acid based etchant may be used.

During etching with the second solution, dissolution of copper contained in the silver-copper brazing alloy progresses. The side surface 21 of each metal plate 2 is made of copper, and is therefore also etched. A solution having different etching rates depending on the crystal orientation of copper is selected as the second solution. The etchant containing sulfuric acid/aqueous hydrogen peroxide has a high etching rate for the {001} plane of copper crystals, and the persulfate/sulfuric acid based etchant has a high etching rate for the {327} and {425} planes of copper crystals. Therefore, copper crystals having easily etched crystal faces exposed at the side surface 21 are dissolved to form the recessed portions 21a in the side surface 21 (FIG. 3). The second etchant has an etching rate less than that of the above-described etchant such as ferric chloride. Therefore, the side surface 21 of each metal plate 2 formed by the etchant is hardly etched except for the portions having the above-described crystal orientations.

The etching with the first solution and the etching with the second solution are alternately performed to remove the portion of the brazing material 3 that protrudes from each metal plate 2 so that the insulating substrate 1 is exposed. FIG. 3 is a sectional view illustrating this state, and FIG. 4 is an enlarged schematic diagram illustrating a part of the side surface 21. The recessed portions 21a that are recessed from the side surface 21 of the metal plate 2 are scattered over the side surface 21 of the metal plate 2. As illustrated in FIG. 4, as a result of the etching with the first solution and the etching with the second solution being alternately performed, the lines 21b are formed in the surface in regions around the recessed portions 21a.

In addition, as illustrated in FIG. 3, a large amount of copper 3C, which is more difficult to etch than silver, remains on the side surface 33 of the brazing material 3. Thus, the above-described side surface 33 of the brazing material 3 on which the ratio of copper is higher than the copper component ratio of the silver-copper brazing alloy is formed. When the composition of the brazing material 3 is slightly out of eutectic composition such that the amount of copper is increased to increase the ratio of copper, the amount of copper 3C on the side surface 33 can be more easily increased. An increase in the melting point due to an increase in the amount of copper can be reduced by adding indium (In), tin (Sn), zinc (Zn), antimony (Sb), or bismuth (Bi).

The side surfaces of the metal plate 2 and the brazing material 3 illustrated in FIGS. 3 and 4 can be easily formed by the above-described manufacturing method 1. The outline patterns of the metal plate 2 and the brazing material 3 and the recessed portions 21a can be continuously and easily formed with high precision simply by changing the etching conditions (for example, etchants).

<Power Module>

Figure 5A:
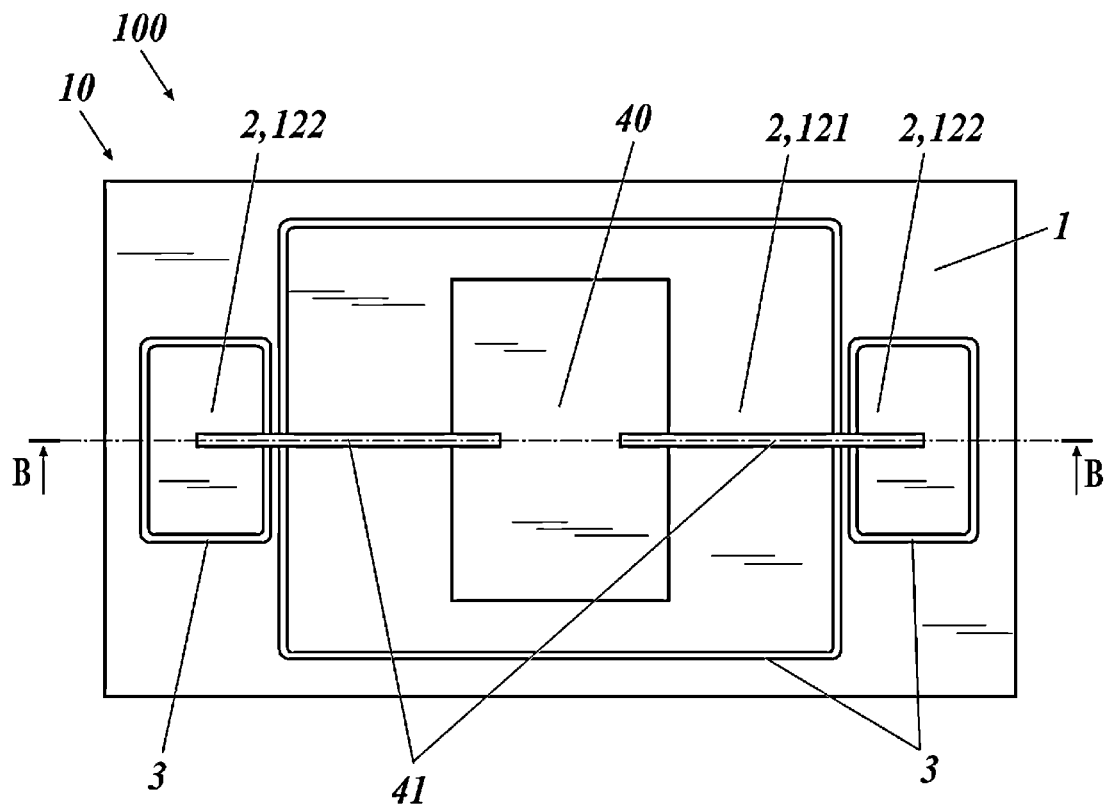
FIG. 5A is a top view of a power module.
Figure 5B:
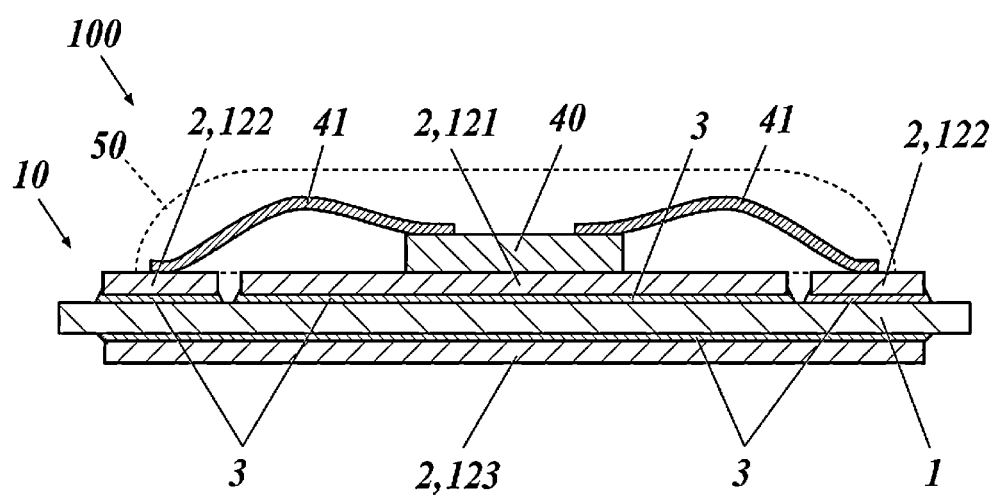
FIG. 5B is a sectional view of FIG. 5A taken along line B-B.

Examples of power modules 100 illustrated in FIGS. 5A and 5B, 6A, and 6B may be formed by mounting an electronic component 40 on the above-described electric circuit board 10 and sealing the electronic component 40 and other components with the sealing resin 50. FIGS. 5A and 5B illustrate a state in which the sealing resin 50 is removed to clearly show the structure in which the electronic component 40 is mounted on one metal plate 2 (121) and connected to other metal plates 2 (122) with bonding wires 41. The power module 100 may be applied to, for example, an automobile and used in an engine control unit (ECU) or various other control units such as those for a power assisted steering wheel and a motor drive. The power module 100 is not limited to those used in control units mounted in automobiles, and may instead be used in, for example, various other inverter control circuits, electric power control circuits, and power conditioners.

In each of the examples of power modules 100 illustrated in FIGS. 5A and 5B, 6A, and 6B, a single electronic component 40 is mounted on the metal plate 2 (121) joined to a central portion of a surface (upper surface) of the ceramic substrate (1). The metal plates 2 (122) arranged on both sides of the metal plate 2 (121) having the electronic component 40 mounted thereon are electrically connected to the electronic component 40 with the bonding wires 41. The metal plates 2 (122) on the outer sides function as terminals for providing connection to an external electric circuit. Heat generated by the electronic component 40 is transmitted to a metal plate 2 (123) joined to the lower surface of the ceramic substrate (1) through the metal plates 2 (121 and 122) joined to the upper surface of the ceramic substrate (1) and the ceramic substrate (1), and is dissipated to the outside. Thus, the metal plate 2 (123) joined to the lower surface of the ceramic substrate (1) functions as a heat dissipating plate. The number of electronic components 40 and the size and mounting position of each electronic component 40 are not limited to those in the examples illustrated in FIGS. 5A and 5B, 6A, and 6B.

The electronic component 40 is, for example, a power semiconductor device, and is used to control electric power in various types of control units such as those described above. Examples of the electronic component 40 include a transistor, such as a metal oxide semiconductor-field effect transistor (MOS-FET) or an IGBT in which Si is used, and a power device in which SiC or GaN is used.

The electronic component 40 is joined and fixed to the corresponding metal plate 2 on the electric circuit board 10 by a joining material (not illustrated). The joining material may be, for example, solder or silver nano-paste. When a metal film is provided on a portion of a surface of the metal plate 2, the size of the electronic component 40 may be less than that of the metal film in plan view. In such a case, a fillet of the joining material is formed to extend from a side surface of the electronic component 40 to the upper surface of the metal film, so that the joining strength between the electronic component 40 and the metal plate (metal film) can be increased. In addition, since the surface of the metal film is covered by the joining material and is not exposed, the adhesion of the sealing resin 50 described below can be improved.

The bonding wires 41 are connecting members that electrically connect terminal electrodes (not illustrated) of the electronic component 40 to the metal plates 2. The bonding wires 41 may be made of, for example, gold or aluminum.

Figure 6A:
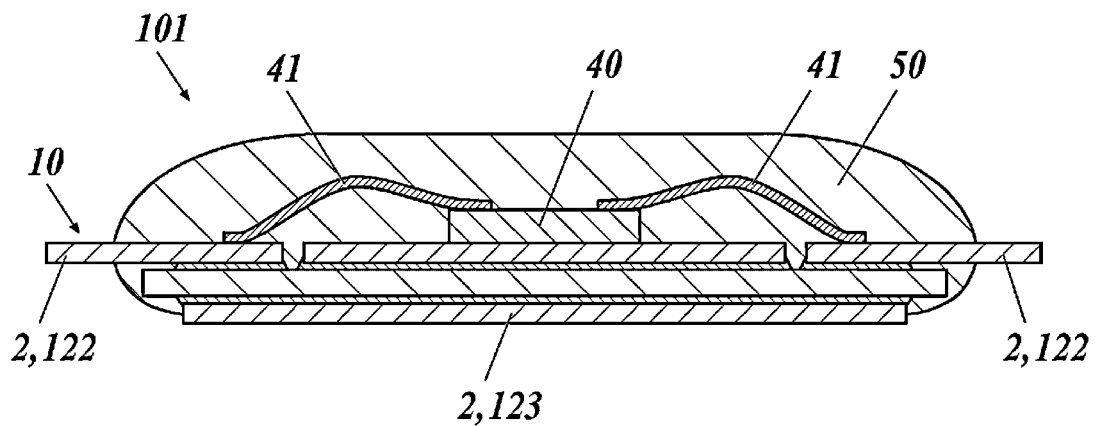
FIG. 6A is a sectional view of another example of a power module.

A power module 101 illustrated in FIG. 6A is a power module including the electric circuit board 10 illustrated in FIGS. 1A, 1B, 2A, and 2B. In this example, the electronic component 40 is sealed by being covered with the sealing resin 50 that spreads from the upper surface of the electric circuit board 10 to an outer peripheral portion of the lower surface of the electric circuit board 10. The sealing resin 50 does not cover a principal surface (lower surface) of the metal plate 2 (123) joined to the lower surface of the ceramic substrate (1). Therefore, the metal plate (123), which functions as a heat dissipating plate, may be directly thermally connected to, for example, an external heat dissipating body. Accordingly, the power module 101 has a high heat dissipation performance. The metal plates 2 (122) that function as terminals are long enough to protrude from the insulating substrate 1, and also protrude from the sealing resin 50. Accordingly, the metal plates 2 (122) that function as terminals can be easily electrically connected to an external electric circuit.

The sealing resin 50 may be a thermosetting resin such as silicone resin, epoxy resin, phenolic resin, or imide resin in consideration of thermal conductivity, insulation performance, environmental resistance, and sealing performance.

Figure 6B:
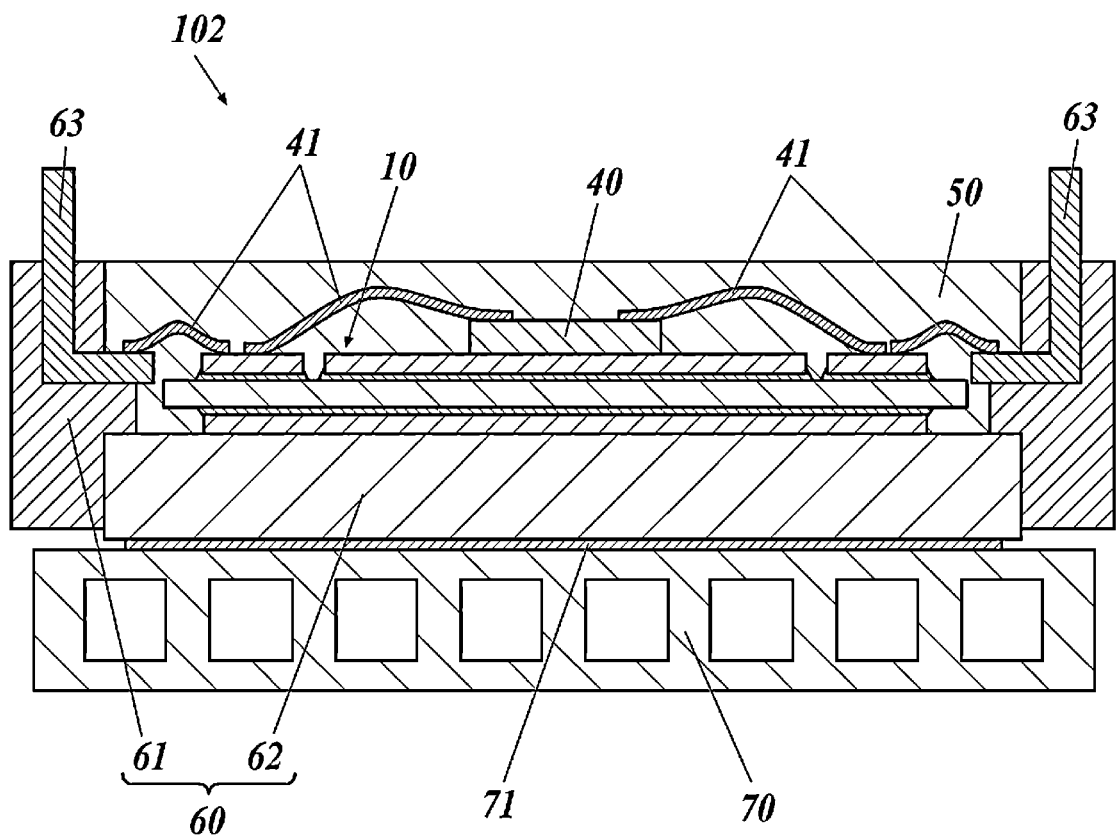
FIG. 6B is a sectional view of another example of a power module.

A power module 102 illustrated in FIG. 6B is a power module including the electric circuit board 10 that is similar to the electric circuit board 10 included in the power module 100 illustrated in FIGS. 5A and 5B. In this example, the electric circuit board 10 is disposed in an internal space of a housing 60 having an inner space, and the internal space is filled with the sealing resin 50 so that the electronic component 40 and the electric circuit board 10 are sealed.

As in the examples illustrated in FIGS. 5A and 5B, 6A, and 6B, the power modules 101 and 102 may include the sealing resin 50 that covers the electronic component 40, the metal plates 2, and the insulating substrate 1. The sealing resin 50 serves to increase the environmental resistance of the electronic component 40 and improve the insulation between the metal plates 121 and 122 that are adjacent to each other.

The housing 60 includes a frame 61 and a heat dissipating plate 62 that covers an opening at one side of the frame 61. The space surrounded by the frame 61 and the heat dissipating plate 62 serves as the inner space. Lead terminals 63 are arranged to extend from the inner space to the outside through the frame 61 of the housing 60. End portions of the lead terminals 63 disposed in the internal space are connected to the metal plates 2 of the electric circuit board 10 with the bonding wires 41. Thus, the electronic component 40 is electrically connectable to an external electric circuit.

The frame 61 is made of a resin material, a metal material, or a mixture thereof, and the heat dissipating plate 62 covers the opening at one side of the frame 61 to form the inner space in which the electric circuit board 10 is disposed. The material of the frame 61 may be a metal material, such as copper or aluminum, or a resin material, such as polybutylene terephthalate (PBT) or polyphenylene sulfide (PPS) in consideration of heat dissipation performance, heat resistance, environmental resistance, and lightness. In particular, a PBT resin is preferred for its availability. In addition, a fiber reinforced resin is preferably formed by adding glass fiber to the PBT resin to increase the mechanical strength.

The lead terminals 63 are conductive terminals attached to the frame 61 such that the lead terminals 63 extend from the inner space to the outside through the frame 61. The end portions of the lead terminals 63 in the inner space are electrically connected to the metal plates 2 of the electric circuit board 10, and outer end portions of the lead terminals 63 are electrically connected to an external electric circuit (not shown) or a power supply (not shown). The lead terminals 63 may be made of various metal materials for conductive terminals, such as Cu, a Cu alloy, Al, an Al alloy, Fe, a Fe alloy, and stainless steel (SUS).

The heat dissipating plate 62 is provided to dissipate heat generated by the electronic component 40 in operation to the outside of the power module 102. The heat dissipating plate 62 may be made of a highly thermally conductive material, such as Al, Cu, or Cu—W. In particular, Al has a higher thermal conductivity and more efficiently dissipates heat generated by the electronic component 40 to the outside of the power module 102 compared to a metal material, such as Fe, that serves as a common structural material. Accordingly, the electronic component 40 reliably performs normal operations. Furthermore, Al is more easily available and less expensive compared to other highly thermally conductive materials, such as Cu and Cu—W, and is therefore advantageous in that the cost of the power module 102 can be reduced.

The heat dissipating plate 62 is thermally connected to the metal plate 2 (123) of the electric circuit board 10 with a heat-transferring joining material (not illustrated). The heat-transferring joining material may be a brazing material that provides thermal connection along with a high mechanical joining strength, or grease that provides thermal connection with a relatively low mechanical joining strength. Alternatively, the sealing resin 50 may be used as described below.

The sealing resin 50 fills the inner space to seal and protect the electronic component 40 mounted on the electric circuit board 10. The same sealing resin 50 that seals the inner space may be used also to mechanically join the electric circuit board 10 and the heat dissipating plate 62 together. In such a case, the electric circuit board 10 and the heat dissipating plate 62 can be mechanically strongly joined together and the inner space can be sealed with resin in the same process.

To further improve the heat dissipation characteristics, the power module 102 may also have a cooling device 70 joined to an exposed surface of the heat dissipating plate 62 with a heat-transferring joining material 71 provided therebetween at a side opposite to the side at which the electric circuit board 10 is joined. The heat-transferring joining material 71 may be a material similar to the heat-transferring joining material with which the heat dissipating plate 62 is connected to the metal plate (123) of the electric circuit board 10. In the example illustrated in FIG. 6B, the cooling device 70 is a block body made of a metal, for example, and having flow passages for allowing refrigerant, such as water, to pass therethrough. However, the cooling device 70 may instead be composed of, for example, a cooling fin. The cooling device 70 may also be applied to the power modules 100, 101 of the examples illustrated in FIGS. 5A and 5B and FIG. 6A by connecting the cooling device 70 to the metal plate 2 (123) of the electric circuit board 10. In such a case, the cooling device 70 may instead be such that only the heat dissipating plate 62 illustrated in FIG. 6B, which is flat plate-shaped, is used as the cooling device 70.

Figure 7:
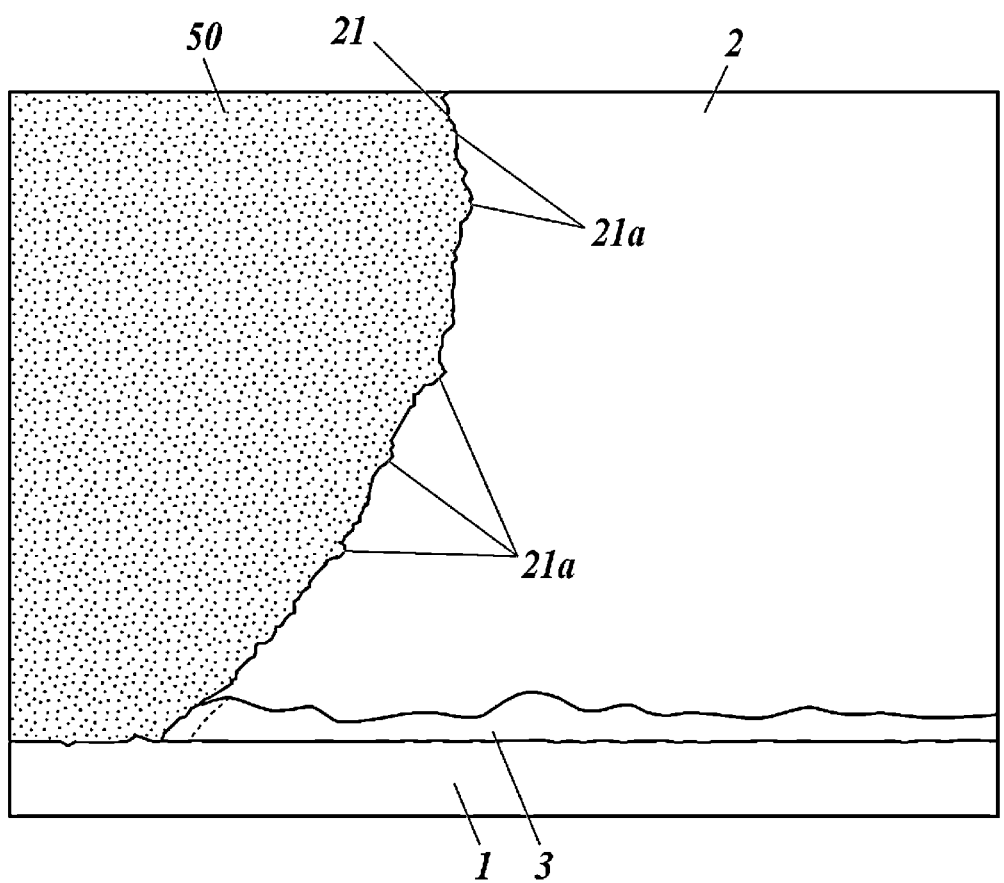
FIG. 7 is a vertical sectional view of a part of a power module.

In the above-described power modules, as illustrated in FIG. 7, the sealing resin 50 that covers the electronic component 40, the metal plates 2, the insulating substrate 1, and other components is joined also to the side surface 21 of each metal plate 2 such that the sealing resin 50 extends into the recessed portions 21a.

Since the sealing resin 50 extends into the recessed portions 21a, the adhesion of the sealing resin 50 is improved. As a result, separation of the sealing resin 50 does not easily occur at high temperatures, and the heat resistance is increased accordingly.

Although embodiments of the present disclosure have been described, the embodiments are illustrative, and various other embodiments are also possible. The components may be omitted, replaced, or altered without departing from the gist of the invention.

In the above-described embodiments, the metal plates 2 are provided on both sides of the insulating substrate 1. However, an electric circuit board may instead be formed by arranging the metal plates 2 only on one side of the insulating substrate 1. The electric circuit board 10 may be produced by forming a so-called multi-piece structure and then dividing the multi-piece structure. A multi-piece electric circuit board may be produced by preparing a large insulating substrate having a plurality of substrate regions, each of which corresponds to the insulating substrate 1 of the electric circuit board 10, and forming the metal plates 2 on each of the substrate regions by the above-described method. When pattern forming method (B) is applied, a metal plate having substantially the same size as the size of the large insulating substrate may be used as the large metal plate.

INDUSTRIAL APPLICABILITY

The present disclosure may be applied to an electric circuit board and a power module.

REFERENCE SIGNS LIST 1 insulating substrate
2 metal plate
3 brazing material
3C copper on side surface of brazing material
10 electric circuit board
21 side surface of metal plate
21a recessed portion
21b line
33 side surface of brazing material
40 electronic component
41 bonding wire
50 sealing resin
100 power module
101 power module
102 power module

The invention claimed is:

1. An electric circuit board comprising an insulating substrate, a metal plate, and a brazing material with which the insulating substrate and the metal plate are joined together,
wherein the metal plate has a side surface over which a plurality of recessed portions are scattered,
wherein a side surface of the brazing material is continuous with the side surface of the metal plate, and the side surface of the brazing material and the side surface of the metal plate form a single concave surface, and
wherein the side surface of the metal plate has grooves in regions around the recessed portions.

2. The electric circuit board according to claim 1, wherein the metal plate is made of copper or a copper alloy.

3. A power module comprising:
the electric circuit board according to claim 1;
an electronic component mounted on the metal plate of the electric circuit board; and
a sealing resin that covers the electronic component, the metal plate, and the insulating substrate, wherein the sealing resin is joined to the side surface of the metal plate such that the sealing resin extends into the recessed portions.

4. The electric circuit board according to claim 2, plate, wherein the brazing material is a silver-copper brazing alloy, and
wherein a ratio of copper on the side surface of the brazing material is higher than a copper component ratio of the silver-copper brazing alloy.

5. The electric circuit board according to claim 4, wherein at least one of indium, tin, zinc, antimony, and bismuth is added to the brazing material.

6. A power module comprising:
the electric circuit board according to claim 2;
an electronic component mounted on the metal plate of the electric circuit board; and
a sealing resin that covers the electronic component, the metal plate, and the insulating substrate,
wherein the sealing resin is joined to the side surface of the metal plate such that the sealing resin extends into the recessed portions.

7. A power module comprising:
an electric circuit board according to claim 4;
an electronic component mounted on the metal plate of the electric circuit board; and
a sealing resin that covers the electronic component, the metal plate, and the insulating substrate,
wherein the sealing resin is joined to the side surface of the metal plate such that the sealing resin extends into the recessed portions.

8. A power module comprising:
the electric circuit board according to claim 5;
an electronic component mounted on the metal plate of the electric circuit board; and
a sealing resin that covers the electronic component, the metal plate, and the insulating substrate,
wherein the sealing resin is joined to the side surface of the metal plate such that the sealing resin extends into the recessed portions.

* * * * *